(12) United States Patent
Anderson et al.

(10) Patent No.: US 8,288,806 B2
(45) Date of Patent: Oct. 16, 2012

(54) ASYMMETRIC FIELD EFFECT TRANSISTOR STRUCTURE AND METHOD

(75) Inventors: Brent A. Anderson, Jericho, VT (US); Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/246,175

(22) Filed: Sep. 27, 2011

(65) Prior Publication Data

US 2012/0168832 A1   Jul. 5, 2012

Related U.S. Application Data

(62) Division of application No. 12/985,060, filed on Jan. 5, 2011, now Pat. No. 8,053,314, which is a division of application No. 11/778,185, filed on Jul. 16, 2007, now Pat. No. 7,915,670.

(51) Int. Cl.
*H01L 29/78* (2006.01)

(52) U.S. Cl. .................. 257/288; 257/E29.255

(58) Field of Classification Search .................. 438/268; 257/327
See application file for complete search history.

(56) References Cited

U.S. PATENT DOCUMENTS

| 6,946,706 | B1 | 9/2005 | Brisbin et al. |
| 2002/0036328 | A1 | 3/2002 | Richards, Jr. et al. |
| 2004/0248368 | A1 | 12/2004 | Natzle et al. |
| 2006/0220120 | A1 | 10/2006 | Horch |
| 2007/0032028 | A1 * | 2/2007 | Zhu et al. ............ 438/303 |
| 2007/0080401 | A1 | 4/2007 | Yang |
| 2007/0267703 | A1 * | 11/2007 | Chong et al. ............ 257/368 |

FOREIGN PATENT DOCUMENTS

| JP | 08204177 | 8/1996 |
| JP | 08330578 | 12/1996 |
| JP | 2001007324 | 1/2001 |

OTHER PUBLICATIONS

PCT International Search Report for International Application No. PCT/US2008/070102, International Searching Authority Communication, Jan. 23, 2009.
Anderson et al., U.S. Appl. No. 11/778,185, Office Action Communication, Aug. 20, 2009, 6 pages.

(Continued)

*Primary Examiner* — Jarrett Stark
*Assistant Examiner* — Lawrence Tynes, Jr.
(74) *Attorney, Agent, or Firm* — Gibb & Riley, LLC; Richard M. Kotulak, Esq.

(57) ABSTRACT

Disclosed are embodiments of an asymmetric field effect transistor structure and a method of forming the structure in which both series resistance in the source region ($R_s$) and gate to drain capacitance ($C_{gd}$) are reduced in order to provide optimal performance (i.e., to provide improved drive current with minimal circuit delay). Specifically, different heights of the source and drain regions and/or different distances between the source and drain regions and the gate are tailored to minimize series resistance in the source region (i.e., in order to ensure that series resistance is less than a predetermined resistance value) and in order to simultaneously to minimize gate to drain capacitance (i.e., in order to simultaneously ensure that gate to drain capacitance is less than a predetermined capacitance value).

19 Claims, 11 Drawing Sheets

100

OTHER PUBLICATIONS

Anderson et al., U.S. Appl. No. 11/869,145, Office Action Communication, Apr. 5, 2010, 14 pages.
Anderson et al., U.S. Appl. No. 11/778,185, Office Action Communication, Mar. 18, 2010, 10 pages.
Anderson et al., U.S. Appl. No. 11/869,145, Notice of Allowance, Jul. 20, 2010, 4 pages.
Anderson et al., U.S. Appl. No. 11/778,185, Office Action Communication, Aug. 27, 2010, 3 pages.
Anderson et al., U.S. Appl. No. 11/778,185, Notice of Allowance, Nov. 23, 2010, 3 pages.
Anderson et al., U.S. Appl. No. 12/985,060, Office Action Communication, May 12, 2011, 8 pages.
Anderson et al., U.S. Appl. No. 12/985,060, Notice of Allowance, Jun. 27, 2011, 11 pages.

* cited by examiner

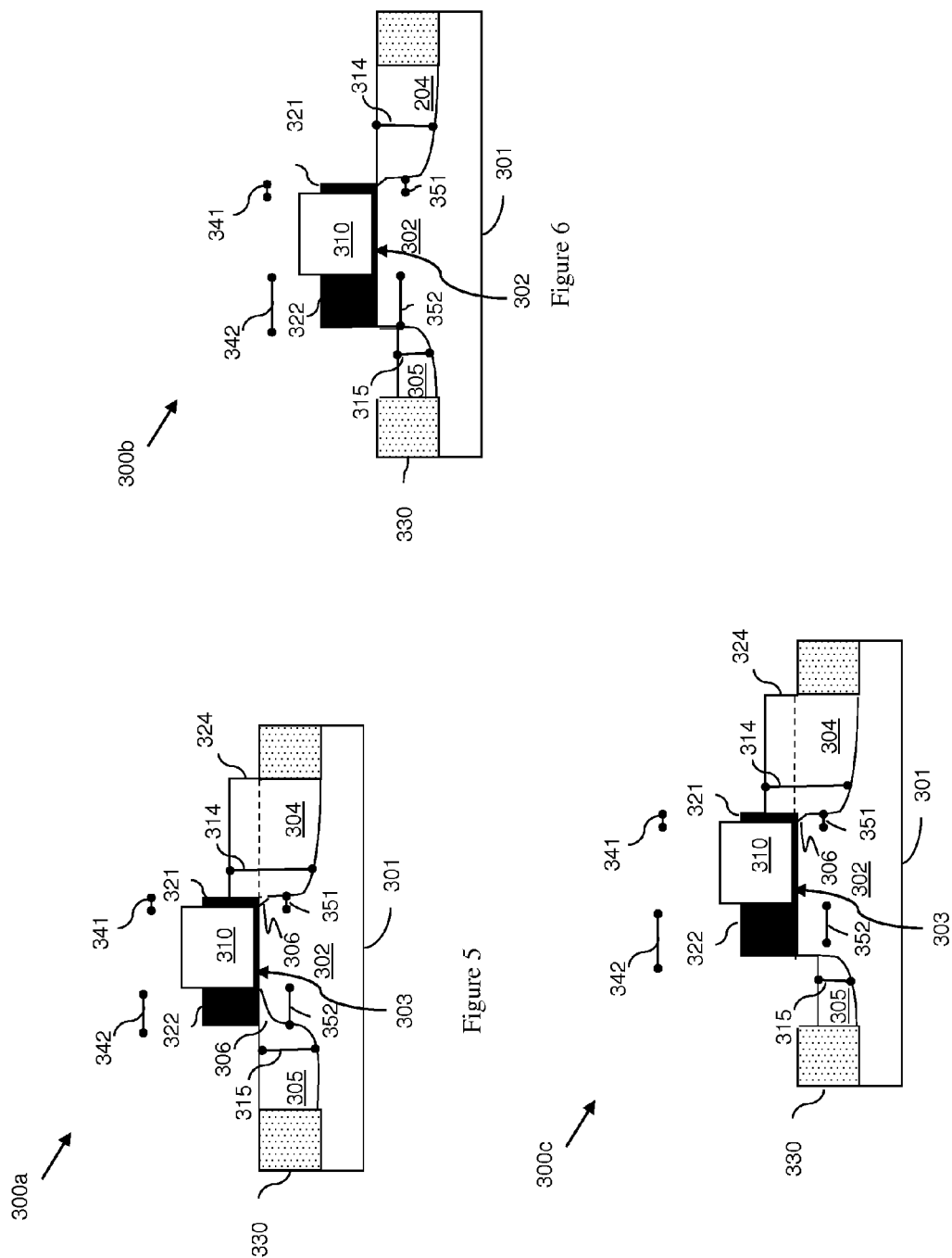

ASYMMETRIC FIELD EFFECT TRANSISTOR STRUCTURE AND METHOD

CROSS-REFERENCE TO RELATED APPLICATIONS

This application is a Division of U.S. application Ser. No. 12/985,060 filed Jan. 5, 2011, and issued as U.S. Pat. No. 8,053,314 on Nov. 8, 2011, the complete disclosure of which, in its entirety, is herein incorporated by reference. Furthermore, U.S. application Ser. No. 12/985,060 was a Division of U.S. application Ser. No. 11/778,185 filed Jul. 16, 2007, and issued as U.S. Pat. No. 7,915,670 on Mar. 29, 2011.

BACKGROUND

1. Field of the Invention

The embodiments herein generally relate to field effect transistors (FETs) and, more particularly, to an asymmetric FET structure and method of forming the structure that provides minimal resistance in the source region and minimal capacitance between gate and drain region in order to optimize performance.

2. Description of the Related Art

In conventional symmetric planar metal oxide semiconductor field effect transistors (MOSFETs), there is an intrinsic trade-off between source/drain series resistance and gate to source/drain capacitance. Specifically, FET saturated currents are more sensitive to source resistance and less sensitive to drain resistance. That is, FET drive current improves more with reduced source resistance, than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance. However, techniques associated with reducing source/drain resistance to improve drive current often simultaneously increase the gate to drain capacitance, thereby increasing circuit delay. Similarly, techniques associated with reducing gate to source/drain capacitance often simultaneously increase source resistance, thereby degrading drive current. Thus, there is often an intrinsic trade-off between decreasing source resistance to improve drive current and decreasing gate to drain capacitance to minimize circuit delay.

SUMMARY

In view of the foregoing, disclosed herein are embodiments of an asymmetric field effect transistor (FET) structure and a method of forming the structure in which both series resistance in the source region ($R_s$) and gate to drain capacitance ($C_{gd}$) are reduced in order to provide optimal performance (i.e., to provide improved drive current with minimal circuit delay). Specifically, different heights of the source and drain regions and/or different distances between the source and drain regions and the gate are tailored to minimize series resistance in the source region (i.e., in order to ensure that series resistance is less than a predetermined resistance value) and to simultaneously to minimize gate to drain capacitance (i.e., in order to simultaneously ensure that gate to drain capacitance is less than a predetermined capacitance value).

One embodiment of the asymmetric field effect transistor (FET) structure comprises a semiconductor substrate. Isolation regions formed in the substrate can set the boundaries of the transistor structure. Within these boundaries, the semiconductor substrate can comprise a center channel region, a source region adjacent the channel region on one side, and a drain region adjacent the channel region opposite the source region. A gate electrode can be positioned on the semiconductor substrate (e.g., approximately equidistance between the isolation regions) so that the channel region is in the semiconductor substrate aligned directly below the gate electrode.

In this embodiment, the source and drain regions can have different heights to minimize series resistance in the source region as well as to simultaneously minimize gate to drain capacitance. Specifically, the source region can have one height relative to the top surface of the channel region and the drain region can have a different lesser height relative to the top surface. This asymmetric configuration allows series resistance in the source region and gate to drain capacitance to be simultaneously minimized. More specifically, the values of the height of the source region and the height of the drain region can be tailored to ensure that series resistance in the source region is less than a predetermined resistance value and to simultaneously ensure that gate to drain capacitance is less than a predetermined capacitance value.

A number of different transistor configurations implementing this embodiment are possible. For example, in one configuration, the height of the source region can be raised so that it is above the level of the top surface of channel region by some predetermined amount and the height of the drain region can be raised above the level of the top surface of the channel region by some lesser amount or can remain approximately level with the top surface of the channel region In another configuration, the height of the source region can remain approximately level with the top surface of the channel region and the height of the drain region can be recessed by some predetermined amount so that it is below the level of the top surface of the channel region. In yet another configuration, the height of the source region can be raised above the level of the top surface of the channel region by some predetermined amount and the height of the drain region can be recessed below the level of the top surface of the channel region by some predetermined amount.

Another embodiment of the asymmetric field effect transistor (FET) structure similarly comprises a semiconductor substrate with isolation regions setting the boundaries of the transistor structure. Within these boundaries, the semiconductor substrate can comprise a center channel region, a source region adjacent the channel region on one side, and a drain region adjacent the channel region opposite the source region. A gate electrode can be positioned on the semiconductor substrate (e.g., approximately equidistance between the isolation regions) so that the channel region is in the semiconductor substrate aligned directly below the gate electrode.

In this embodiment, in addition to having different heights, the source and drain regions of the transistor structure can further be separated from the gate electrode by different distances in order to further minimize series resistance in the source region as well as to further minimize gate to drain capacitance. Specifically, the source region can have one height relative to the top surface of the channel region and the drain region can have a different lesser height relative to the top surface of the channel region. Additionally, the source region can be separated from the gate electrode by one distance and the drain region can be separated from the gate electrode by a different greater distance. This asymmetric configuration allows for additional tailoring of the series resistance and gate to drain capacitance (i.e., allows for even greater simultaneous minimization of series resistance in the source region and gate to drain capacitance) over asymmetric source and drain heights alone. More specifically, the values of the height of the source region, the height of the drain region, the distance between the source and gate and the distance between the drain and gate can be tailored to ensure that series resistance in the source region is less than a predetermined resistance value and to simultaneously ensure that gate to drain capacitance is less than a predetermined capacitance value.

A number of different transistor configurations implementing this embodiment are possible. In each of these exemplary configurations, series resistance in the source region and gate to drain capacitance are minimized not only due to the different heights of the source and drain regions, but also due to the different distances between the source and drain regions and the gate. For example, in one configuration, the source region can be raised so that it is above the level of the top surface of channel region by some predetermined amount and the height of the drain region (which is separated from the gate by a greater predetermined distance) can be raised above the level of the top surface of the channel region by some lesser amount or can remain approximately level with the top surface. In another configuration, the height of the source region (which is separated from the gate by one predetermined distance) can remain approximately level with the top surface of the channel region and the height of the drain region (which is separated from the gate by a greater predetermined distance) can be recessed by some predetermined amount so that it is below the level of the top surface of the channel region. In yet another configuration, the height of the source region (which is separated from the gate by one predetermined distance) can be raised above the level of the top surface of the channel region by some predetermined amount and the height of the drain region (which is separated from the gate by a greater predetermined distance) can be recessed below the level of the top surface of the channel region by some predetermined amount.

Separation of the source and drain regions from the gate electrode by different predetermined distances can, for example, be accomplished by means of gate sidewall spacers having different predetermined widths. That is, the transistor structure can further comprise a sidewall spacer adjacent to the source-side of the gate electrode. This source-side sidewall spacer can comprise a nitride sidewall spacer having a predetermined width that is approximately equal to the desired distance between the source region and the source-side of the gate electrode. The transistor structure can also further comprise another sidewall spacer adjacent to the drain-side of the gate electrode. This drain-side sidewall spacer can similarly comprise a nitride sidewall spacer. However, the predetermined width of the drain-side sidewall spacer can be greater than that of the source-side sidewall spacer. That is, the drain-side sidewall spacer can be approximately equal to the desired distance between the drain region and the drain-side of the gate electrode. Then, during formation, the gate sidewall spacer widths can be used to effectively control positioning of the source and drain dopants during implantation. Thus, the values of the different heights of the source and drain regions and the different sidewall spacer widths (representing the different distances between the source and drain regions and the gate) can be tailored to ensure that series resistance in the source region is less than a predetermined resistance value and to simultaneously ensure that gate to drain capacitance is less than a predetermined capacitance value.

Also disclosed are embodiments of a method for forming the above-described asymmetric FET structures. One method embodiment comprises providing a semiconductor substrate. Isolation regions can be formed in the semiconductor substrate. A gate electrode can be formed on the semiconductor substrate above an area designated for the transistor channel region (e.g., approximately equidistance between the isolation regions) such that the channel region is aligned directly below the gate electrode.

This method embodiment can further comprise predetermining the height of the source region and the height of the drain region relative to the top surface of the channel region. Specifically, this predetermining process can comprise tailoring the height of the source region and the height of the drain region so that the height of the drain region is less than the height of the source region. This asymmetric configuration allows series resistance in the source region and gate to drain capacitance to be simultaneously minimized. More specifically, the different heights of the source and drain regions can be tailored so that series resistance in the source region is less than a predetermined resistance value and so that gate to drain capacitance is less than a predetermined capacitance value.

Thus, for example, the predetermining process can comprise predetermining the height of the source region so that it will be raised above the level of the top surface of channel region by some predetermined amount and predetermining the height of the drain region so that it will be raised above the level of the top surface of the channel region by some lesser amount or remain approximately level with the top surface of the channel region. Alternatively, the predetermining process can comprise predetermining the height of the source region so that it will remain approximately level with the top surface of the channel region and predetermining the height of the drain region so that it will be recessed by some predetermined amount below the level of the top surface of the channel region. Alternatively, the predetermining process can comprise predetermining the height of the source region so that it will be raised above the level of the top surface of the channel region by some predetermined amount and predetermining the height of the drain region so that it will be recessed below the level of the top surface of the channel region by some predetermined amount.

Once the different heights of the source and drain regions are predetermined, the deep source and drain regions can each be formed in the semiconductor substrate on either side of the channel region with their respective predetermined heights. Due to the different predetermined heights, the deep source and drain regions may be formed separately (i.e., formed using separate and different method steps). For example, in order to form a source region that is to be raised above the level of the top surface of the channel region, the semiconductor substrate on the drain-side of the gate electrode can be masked. Next, a gate sidewall spacer can be formed adjacent to the gate electrode on the source-side and an additional semiconductor layer (e.g., an epitaxially grown silicon layer) can be formed above the semiconductor substrate adjacent to the gate sidewall spacer. Formation of the gate sidewall spacer and additional semiconductor layer can be preceded by an implantation process for forming a shallow source extension region. Formation of the additional semiconductor layer can be followed by another implantation process for forming the deep source region. Similar process steps can be applied on the drain-side to form a drain region that is raised above the level of the top surface of the channel region by some lesser amount.

In order to form a deep drain region that is recessed below the level of the top surface of the channel region, the semiconductor substrate on the source-side of the gate electrode can be masked. Next, a gate sidewall spacer can be formed adjacent to the gate electrode on the drain-side. A selective etch process can be used to recess the exposed semiconductor substrate adjacent to the gate sidewall spacer. Recessing the drain-side substrate can be followed by an implantation process for forming the deep drain region.

It should be noted that, during the deep source and drain implant processes, the widths of the gate sidewall spacers control the positioning of the deep source region and deep drain region, relative to the gate electrode. In this embodiment, the gate sidewall spacers are formed symmetrically. Thus, the source and drain regions will be separated from the gate electrode by the same distance (i.e., by a distance that is approximately equal to the sidewall spacer width).

Another method embodiment similarly comprises providing a semiconductor substrate. Isolation regions can be form in the semiconductor substrate. A gate electrode can be formed on the semiconductor substrate above an area designated for the transistor channel region (e.g., approximately equidistance between the isolation regions) such that the channel region is aligned directly below the gate electrode.

This method embodiment further comprises predetermining not only different heights for the source and drain regions relative to the top surface of the channel region, but also predetermining different distances between the source and drain regions and the gate electrode in order to simultaneously minimize series resistance in the source region and gate to drain capacitance. That is, this method embodiment comprises predetermining each of the following: the height of the source region, the height of the drain region, the distance between the source region and one side of the gate electrode, and the distance between the drain region and the opposite side of the gate electrode. The heights of the source and drain regions are predetermined relative to the top surface of the channel region. Specifically, this predetermining process can comprise tailoring the different heights of the source and drain regions and the different distances between the source and drain regions and the gate so that the height of the drain region is less than the height of the source region and also so that the distance between the drain region and the gate is greater than the distance between the source region and the gate. This asymmetric configuration allows for additional tailoring of the series resistance and gate to drain capacitance (i.e., allows for even greater simultaneous minimization of series resistance in the source region and gate to drain capacitance) over the transistor configurations with asymmetric source and drain heights alone. More specifically, the different predetermined heights and different predetermined distances can be tailored so that series resistance in the source region is less than a predetermined resistance value and so that gate to drain capacitance is less than a predetermined capacitance value.

Thus, for example, the predetermining process can comprise predetermining the height of the source region so that it will be raised above the level of the top surface of channel region by some predetermined amount and predetermining the height of the drain region so that it will be raised above the level of the top surface of the channel region by some lesser amount or remain approximately level with the top surface of the channel region. Alternatively, the predetermining process can comprise predetermining the height of the source region so that it will remain approximately level with the top surface of the channel region and predetermining the height of the drain region so that it will be recessed by some predetermined amount below the level of the top surface of the channel region. Alternatively, the predetermining process can comprise predetermining the height of the source region so that it will be raised above the level of the top surface of the channel region by some predetermined amount and predetermining the height of the drain region so that it will be recessed below the level of the top surface of the channel region by some predetermined amount. Again, varying the heights of the source and drain regions can be combined with varying the distances between the source and drain regions and the gate electrode to achieve the desired results.

Next, the source and drain regions can be formed in the semiconductor substrate on either side of the channel region (i.e., on either side of the gate electrode) such that the source and drain regions have with their respective predetermined heights and are separated from the gate electrode by the respective predetermined distances. Due to the different predetermined heights and the different separation distances, the deep source and drain regions may be formed separately.

For example, in order to form a source region that is to be raised above the level of the top surface of the channel region and separated from the gate electrode by a predetermined distance, the semiconductor substrate on the drain-side of the gate electrode can be masked. Next, a gate sidewall spacer with a predetermined width approximately equal to the predetermined distance can be formed adjacent to the gate electrode on the source-side. Then, an additional semiconductor layer (e.g., an epitaxially grown silicon layer) can be formed above the semiconductor substrate adjacent to the gate sidewall spacer. Formation of the gate sidewall spacer and additional semiconductor layer can be preceded by an implantation process for forming a shallow source extension region. Formation of the additional semiconductor layer can be followed by another implantation process for forming the deep source region. Similar process steps can be applied on the drain-side to form a drain region that is raised above the level of the top surface of the channel region by some lesser amount.

In order to form a deep drain region that is recessed below the level of the top surface of the channel region, the semiconductor substrate on the source-side of the gate electrode can be masked. Next, a gate sidewall spacer with a predetermined width approximately equal to the predetermined distance can be formed adjacent to the gate electrode on the drain-side. A selective etch process can be used to recess the exposed semiconductor substrate adjacent to the gate sidewall spacer. Recessing the drain-side substrate can be followed by an implantation process for forming the deep drain region.

It should be noted that, during the deep source and drain implant processes, the different widths of the gate sidewall spacers control the positioning of the deep source region and deep drain region, respectively, relative to the gate electrode. In this embodiment, the gate sidewall spacers are formed asymmetrically (i.e., with different predetermined widths that are approximately equal to the desired separation distances). Thus, the source and drain regions will be separated from the gate electrode by the different predetermined distances.

These and other aspects of the embodiments herein will be better appreciated and understood when considered in conjunction with the following description and the accompanying drawings. It should be understood, however, that the following descriptions, while indicating preferred embodiments herein and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5 is a schematic diagram illustrating a field effect transistor structure 300a according to a second embodiment herein;

FIG. 6 is a schematic diagram illustrating a field effect transistor structure 300b according to the second embodiment herein;

FIG. 7 is a schematic diagram illustrating a field effect transistor structure 300c according to the second embodiment herein;

DETAILED DESCRIPTION OF PREFERRED EMBODIMENTS

Figure 1:
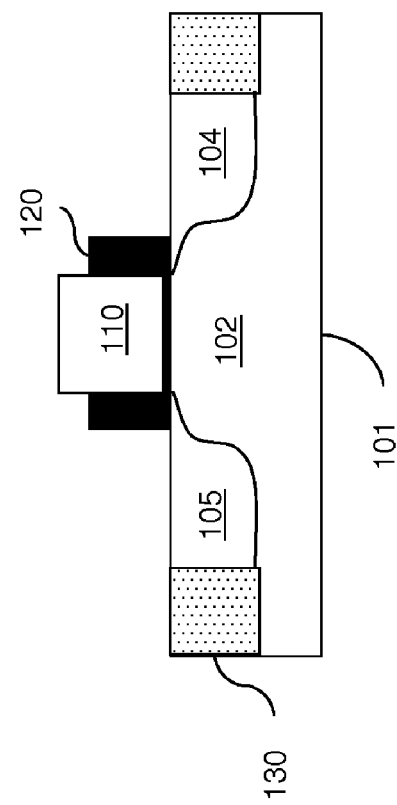
FIG. 1 is a schematic diagram illustrating a field effect transistor.

The embodiments herein and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

FIG. 1 illustrates a conventional symmetric planar metal oxide semiconductor field effect transistor (MOSFET) 100. This MOSFET 100 comprises a semiconductor substrate 101 (e.g., a silicon layer of a silicon-on-insulator (SOI) wafer or a bulk silicon wafer). Isolation regions 130 are formed in the substrate 101 and set the boundaries of the transistor structure 100. Within these boundaries, the semiconductor substrate 101 can comprise a center channel region 102 having a top surface 103, a source region 104 adjacent to the channel region 102 on one side, and a drain region 105 adjacent to the channel region 102 opposite the source region 104. A gate electrode 110 (i.e., a gate dielectric layer and gate conductor stack) can be positioned on the semiconductor substrate 101 (e.g., approximately equidistance between the isolation regions) so that the channel region 102 is in the semiconductor substrate 101 directly below the gate electrode 101. This transistor structure 100 is essentially symmetric. Specifically, the size and placement of the source and drain regions relative to channel region is approximately the same. That is, the heights of the source and drain regions are the same relative to the top surface of the channel region. Additionally, symmetric gate sidewall spacers 120 (i.e., gate sidewalls spacers having the same width) establish the spacing between the source and drain regions 104-105 and the gate 110 such that the distance between the source region 104 and the gate 110 and the distance between the drain region 105 and the gate 110 is approximately the same.

As discussed above, with the symmetric transistor structure 100 there is an intrinsic trade-off between source/drain series resistance and gate to source/drain capacitance. Specifically, FET saturated currents are more sensitive to source resistance and less sensitive to drain resistance. That is, FET drive current improves more with reduced source resistance, than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance. However, techniques associated with reducing source/drain resistance to improve drive current often simultaneously increase the gate to drain capacitance, thereby increasing circuit delay. Similarly, techniques associated with reducing gate to source/drain capacitance often simultaneously increase source resistance, thereby degrading drive current. Thus, in symmetric fin-type FET structure, such as that illustrated in FIG. 1, there is an intrinsic trade-off between decreasing source resistance to improve drive current and decreasing gate to drain capacitance to minimize circuit delay.

In view of the foregoing, disclosed herein are embodiments of an asymmetric field effect transistor (FET) structure and a method of forming the structure in which both series resistance in the source region ($R_s$) and gate to drain capacitance ($C_{gd}$) are reduced in order to provide optimal performance (i.e., to provide improved drive current with minimal circuit delay). Specifically, different heights of the source and drain regions and/or different distances between the source and drain regions and the gate are tailored to minimize series resistance in the source region (i.e., in order to ensure that series resistance is less than a predetermined resistance value) and in order to simultaneously to minimize gate to drain capacitance (i.e., in order to simultaneously ensure that gate to drain capacitance is less than a predetermined capacitance value).

Figure 3:
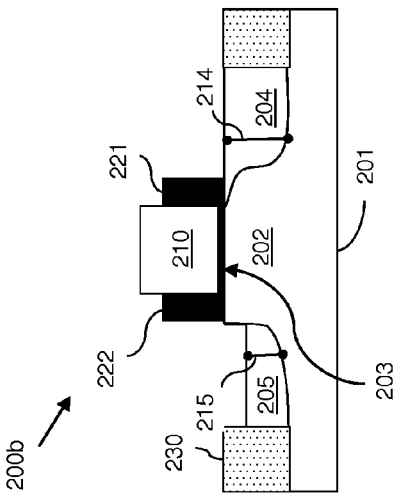
FIG. 3 is a schematic diagram illustrating a field effect transistor structure 200b according to the first embodiment herein.
Figure 2:
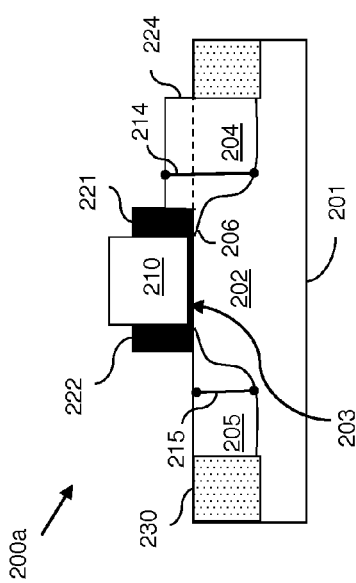
FIG. 2 is a schematic diagram illustrating a field effect transistor structure 200a according to a first embodiment herein.
Figure 4:
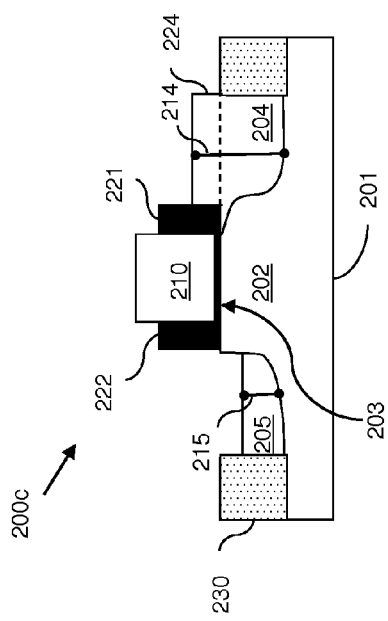
FIG. 4 is a schematic diagram illustrating a field effect transistor structure 200c according to the first embodiment herein.

FIGS. 2-4 illustrate various configurations of one embodiment of an asymmetric field effect transistor (FET) structure 200. This embodiment 200 comprises a semiconductor substrate 201 (e.g., a silicon layer of a silicon-on-insulator (SOI)

wafer or a bulk silicon wafer). Isolation regions 230 (e.g., dielectric-filled shallow trench isolation regions) formed in the substrate 201 can set the boundaries of the transistor structure 200. Within these boundaries, the semiconductor substrate 201 can comprise a center channel region 202 having a top surface 203, a deep source region 204 adjacent to the channel region 202 on one side, and a deep drain region 205 adjacent to the channel region 202 opposite the source region 204.

The source and drain regions 204, 205 can be appropriately doped (e.g., implanted) with n-type or p-type dopants for n-type or p-type transistors, respectively. For example, for an n-type transistor the source and drain regions 204, 205 can be doped with an n-type dopant, such as phosphorus (P), arsenic (As) or antimony (Sb). Whereas, for a p-type transistor, the source and drain regions 204, 205 can be doped with a p-type dopant, such as boron (B). The semiconductor substrate 201 can optionally further comprise appropriately doped shallow source/drain extension regions 206 and/or halo regions.

A gate electrode 210 (i.e., a gate dielectric layer-gate conductor layer stack, for example, a gate oxide layer-gate polysilicon layer stack) can be positioned on the semiconductor substrate 201. The gate electrode 210 can, for example, be positioned approximately equidistance between the isolation regions 230 with the channel region 203 in the semiconductor substrate 201 aligned directly below the gate electrode 210.

Symmetric gate sidewall spacers 221-222 (i.e., sidewall spacers that are the same size, same height, same width, etc.), such as nitride spacers, on each side of the gate electrode 210 can be used to establish the distance between the deep source and drain regions 204, 205 and the gate electrode 210.

In this embodiment 200, the source and drain regions 204, 205 can have different heights 214, 215 that are tailored to minimize series resistance in the source region as well as to simultaneously minimize gate to drain capacitance. Specifically, the source region 204 can have one height 214 (i.e., a first predetermined height) relative to the top surface 203 of the channel region 202 and the drain region 205 can have a different height 215 (i.e., a second predetermined height) relative to the top surface 203 of the channel region 202. The predetermined height 215 of the drain region 205 can be less than the predetermined height 214 of the source region 204 (i.e., the height of the drain region can be lower relative to the top surface of the channel region than the height of the source region). This asymmetric configuration allows series resistance in the source region and gate to drain capacitance to be simultaneously minimized. More specifically, the values of the height 214 of the source region 204 and the height 215 of the drain region 205 can be tailored to ensure that series resistance in the source region is less than a predetermined resistance value and to simultaneously ensure that gate to drain capacitance is less than a predetermined capacitance value.

A number of different transistor configurations implementing this embodiment are possible. For example, referring to FIG. 2 in one configuration 200a, the height 214 of the source region 204 can be raised (e.g., by an additional layer of semiconductor material 224, such as a doped epitaxial silicon layer) so that it is above the level of the top surface 203 of channel region 202 by some predetermined amount and the height 215 of the drain region 205 can be raised above the level of the top surface of the channel region by some lesser amount or remain approximately level with the top surface 203 of the channel region 202. Referring to FIG. 3, in another configuration 200b, the height 214 of the source region 204 can remain approximately level with the top surface 203 of the channel region 202 and the height 215 of the drain region 205 can be recessed (e.g., selectively etched back) by some predetermined amount so that it is below the level of the top surface 203 of the channel region 202. Referring to FIG. 4, in yet another configuration 200c, the height 214 of the source region 204 can be raised (e.g., by an additional layer of semiconductor material 224, such as a doped epitaxial silicon layer) above the level of the top surface 203 of the channel region 202 by some predetermined amount and the height 215 of the drain region 205 can be recessed (e.g., selectively etched back) below the level of the top surface 203 of the channel region 202 by some predetermined amount.

Increasing the height of the source region relative to the height of the drain region decreases series resistance in the source region without simultaneously increasing gate to drain capacitance and, thereby, improves drive current without increasing circuit delay. Increasing the height of the source region does increase gate to source capacitance; however, transistor performance is not as sensitive to gate to source capacitance as it is to gate to drain capacitance. Decreasing the height of the drain region relative to the height of the source region decreases gate to drain capacitance without increasing series resistance in the source region and, thereby, minimizes circuit delay without degrading drive current.

FIGS. 5-7 illustrate various configurations of another embodiment of an asymmetric field effect transistor (FET) structure 300. This embodiment 300 similarly comprises a semiconductor substrate 301 (e.g., a silicon layer of a silicon-on-insulator (SOI) wafer or a bulk silicon wafer). Isolation regions 330 (e.g., dielectric-filled shallow trench isolations regions) can be formed in the substrate 301 and can set the boundaries of the transistor structure 300. Within these boundaries, the semiconductor substrate 301 can comprise a center channel region 302 having a top surface 303, a deep source region 304 adjacent to the channel region 302 on one side, and a deep drain region 305 adjacent to the channel region 302 opposite the source region 304.

The source and drain regions 304, 305 can be appropriately doped (e.g., implanted) with n-type or p-type dopants for n-type or p-type transistors, respectively. For example, for an n-type transistor the source and drain regions 304, 305 can be doped with an n-type dopant, such as phosphorus (P), arsenic (As) or antimony (Sb). Whereas, for a p-type transistor, the source and drain regions 304, 305 can be doped with a p-type dopant, such as boron (B). The semiconductor substrate 301 can optionally further comprise appropriately doped shallow source/drain extension regions 306 and/or halo regions.

A gate electrode 310 (i.e., a gate dielectric layer-gate conductor layer stack, for example, a gate oxide layer-gate polysilicon layer stack) can be positioned on the semiconductor substrate 301. The gate electrode 310 can, for example, be positioned approximately equidistance between the isolation regions 330 with the channel region 303 in the semiconductor substrate 301 aligned directly below the gate electrode 310.

In this embodiment 300, in addition to having different heights 314, 315, the source and drain regions 304, 305 of the transistor structure 300 can further be separated from the gate electrode 310 by different distances 351, 352 in order to further minimize series resistance in the source region as well as to further minimize gate to drain capacitance. Specifically, the source region 304 can have one height 314 (i.e., a first predetermined height) relative to the top surface 303 of the channel region 302 and the drain region 305 can have a different lesser height (i.e., a second predetermined height) relative to the top surface 303 of the channel region 302. That is, the height of the drain region can be lower, relative to the top surface of the channel region, than the height of the source region. Additionally, the source region 304 can be separated from the gate electrode 310 by one distance 351 (i.e., a first predetermined distance) and the drain region 305 can be separated from the gate electrode 310 by a different greater distance 352 (i.e., a second predetermined distance). The predetermined height 315 of the drain region 305 can be less than the predetermined height 314 of the source region 304 and furthermore the predetermined distance 352 between the drain 305 and gate 310 can be greater than the predetermined distance 351 between the source 304 and gate 310. This asymmetric configuration allows for additional tailoring of the series resistance and gate to drain capacitance (i.e., allows for even greater simultaneous minimization of series resistance in the source region and gate to drain capacitance). More specifically, the values of the height 314 of the source region 304, the height 315 of the drain region 305, the distance 351 between the source 304 and gate 310 and the distance 352 between the drain 305 and gate 310 can be tailored to ensure that series resistance in the source region is less than a predetermined resistance value and to simultaneously ensure that gate to drain capacitance is less than a predetermined capacitance value.

A number of different transistor configurations implementing this embodiment are possible. In each of these exemplary configurations, series resistance in the source region and gate to drain capacitance are minimized not only due to the different heights 314, 315 of the source and drain regions 304, 305, but also due to the different distances 351, 352 between the source and drain regions and the gate. For example, referring to FIG. 5, in one configuration 300a the height 314 of the source region 304 (which is separated from the gate 310 by one distance 351) can be raised (e.g., by an additional semiconductor layer 324, such as a doped epitaxial silicon layer) so that it is above the level of the top surface 303 of channel region 302 by some predetermined amount and the height 315 of the drain region 305 (which is separated from the gate 310 by a greater distance 352) can be raised above the level of the top surface of the channel region by some lesser amount or remain approximately level with the top surface 303 of the channel region 302. Referring to FIG. 6, in another configuration 300b the height 314 of the source region 304 (which is separated from the gate 310 by one distance 351) can remain approximately level with the top surface 303 of the channel region 302 and the height 315 of the drain region 305 (which is separated from the gate 310 by a greater distance 352) can be recessed (e.g., selectively etched back) by some predetermined amount so that it is below the level of the top surface 303 of the channel region 302. Referring to FIG. 7, in yet another configuration 300c the height 314 of the source region 304 (which is separated from the gate 310 by one distance 351) can be raised (e.g., by an additional semiconductor layer 324, such as a doped epitaxial silicon layer) above the level of the top surface 303 of the channel region 302 by some predetermined amount and the height 315 of the drain region 305 (which is separated from the gate 310 by a greater distance 352) can be recessed (e.g., selectively etched back) below the level of the top surface 303 of the channel region 302 by some predetermined amount.

Separation of the deep source and drain regions 304, 305 from the gate electrode 310 by different predetermined distances 351, 352 can, for example, be accomplished by means of gate sidewall spacers 321, 322 having different predetermined widths 341, 342. That is, the transistor structure 300 can further comprise a sidewall spacer 321 adjacent to the source-side of the gate electrode 310 (i.e., a first sidewall spacer on a first side of the gate electrode). This source-side sidewall spacer 321 can comprise a nitride sidewall spacer having a first predetermined width 341 that is approximately equal to the desired distance 351 between the deep source region 304 and the source-side of the gate electrode (i.e., approximately equal to the first predetermined distance). The transistor structure 300 can also further comprise another sidewall spacer 322 adjacent to the drain-side of the gate electrode 310 (i.e., a second sidewall spacer on a second side of the gate electrode). This drain-side sidewall spacer 322 can similarly comprise a nitride sidewall spacer, but can have a second predetermined width 342 that is greater than the width 341 of the source-side sidewall spacer 321. Specifically, the predetermined width 342 of the drain-side sidewall spacer 322 can be approximately equal to the desired distance 352 between the deep drain region 305 and the drain-side of the gate electrode 310 (i.e., approximately equal to the second predetermined distance). If, during the transistor formation process, the gate sidewall spacers are used to effectively control positioning of the deep source and drain implants, then the values different sidewall spacer widths 341, 342 (representing the predetermined desired distances 351, 352 between the source and drain regions 304, 305 and the gate electrode 310) along with the different heights 314, 315 of the source and drain regions 304, 305 can be tailored to ensure that series resistance in the source region is less than a predetermined resistance value and to simultaneously ensure that gate to drain capacitance is less than a predetermined capacitance value.

As discussed above, increasing the height 314 of the source region 304 without increasing the height 315 of the drain region 305 decreases series resistance in the source region without increasing gate to drain capacitance and, thereby, improves drive current without increasing circuit delay. Increasing the height 314 of the source region 304 does increase gate to source capacitance; however, transistor performance is not as sensitive to gate to source capacitance as it is to gate to drain capacitance. Recessing (i.e., reducing the height 315) of the drain region 305 without recessing the source region 304 decreases gate to drain capacitance without increasing series resistance in the source region and, thereby, minimizes circuit delay without degrading drive current. Additionally, reducing the width 341 of the source-side sidewall spacer 321 without reducing the width 342 of the drain-side sidewall spacer 322 effectively reduces series resistance on the source side of the channel region without increasing gate to drain capacitance and, thereby, improves drive current without increasing circuit delay. Although gate to source capacitance is increased by reducing the thickness 341 of the source-side sidewall spacer 321 and moving the deep source region 304 closer to the gate 310, transistor performance is not as sensitive to such gate to source capacitance as it is to gate to drain capacitance. Furthermore, increasing the width 342 of the drain-side sidewall spacer 322 without increasing the width 341 of the source-side sidewall spacer 321 decreases gate to drain capacitance without increasing series resistance in the source region and, thereby, minimizes circuit delay without degrading drive current. Although series resistance on the drain side of the channel region is increased as a result of the increased distance 352 between the gate 310 and drain region 305, transistor performance is not as sensitive to such series resistance in the drain region as it is to series resistance in the source region.

Figure 8:
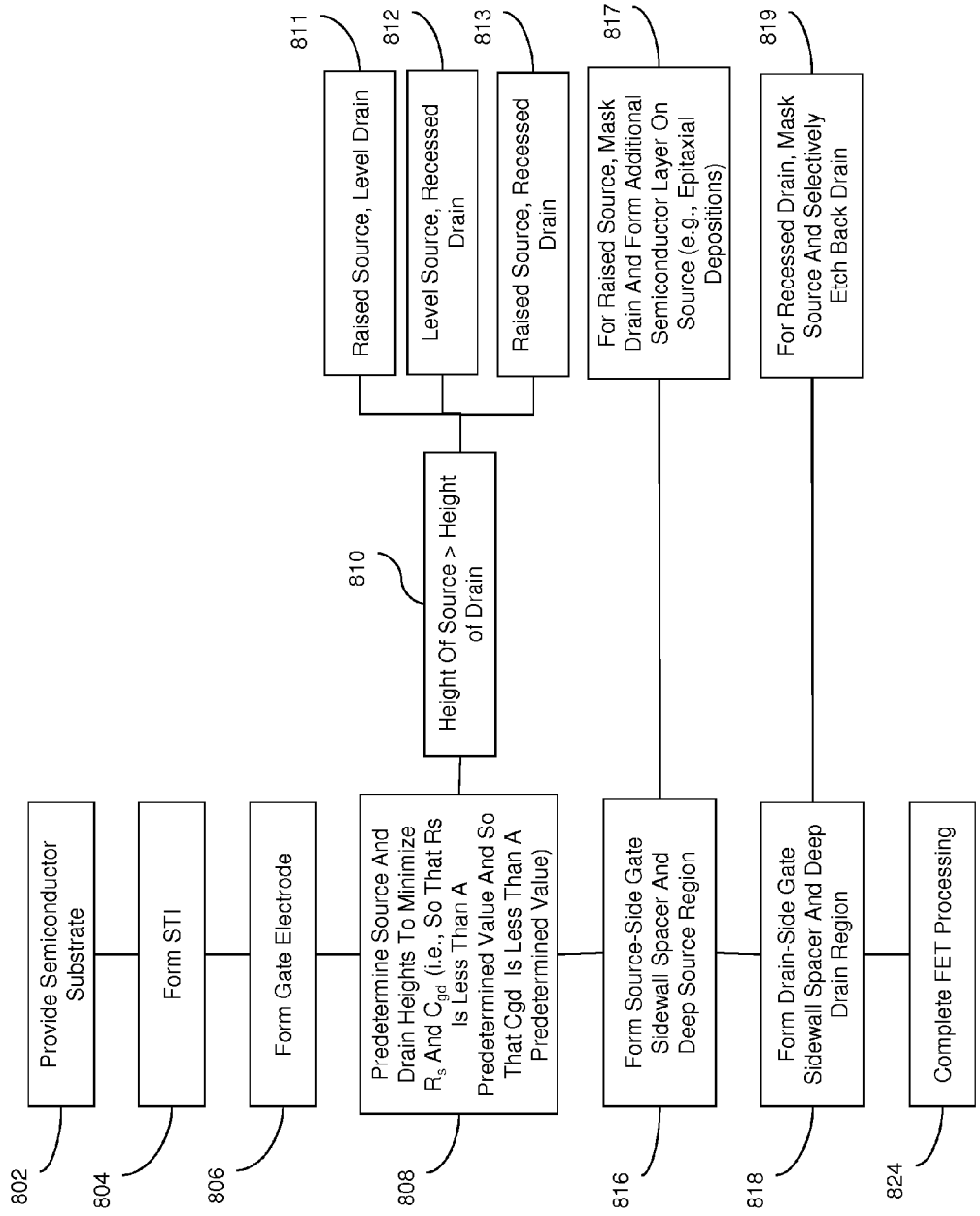
FIG. 8 is a flow diagram illustrating an embodiment of a method for forming the structures 200a-c of FIGS. 2-4.

Referring to FIG. 8 in combination with FIGS. 2-4, also disclosed is an embodiment of a method for forming the above-described asymmetric field effect transistor (FET) structure 200. This method embodiment comprises providing a semiconductor substrate 201 (e.g., a silicon layer of a silicon-on-insulator (SOI) wafer or a bulk silicon wafer) (802). Isolation regions 230 (e.g., dielectric-filled shallow trench isolation regions) can be form in the semiconductor substrate 201 using conventional processing techniques so as to set the boundaries of the transistor structure 200 (804).

Next, using conventional processing techniques, a gate electrode 210 can be formed on the semiconductor substrate 201 above an area designated for the transistor channel region 202 (e.g., approximately equidistance between the isolation regions 230) such that the channel region 202 is below the gate electrode 210 (806). That is, a dielectric layer (e.g., a gate oxide layer) can be deposited. Deposition of the gate dielectric layer can be followed by deposition of a gate conductor layer (e.g., a gate polysilicon layer) and optionally a cap layer (e.g., a nitride cap layer), thereby, forming a gate stack. This gate stack can then be lithographically patterned and etched to form the gate electrode 210 above the area of the semiconductor substrate 201 designated as the channel region 202.

This method embodiment further comprises predetermining the height of the source region (i.e., the first height) and the height of the drain region (i.e., the second height) (808). These heights are determined relative to the top surface of the channel region. Specifically, this predetermining process can comprise tailoring the height of the source region and the height of the drain region so that the height of the drain region is less than the height of the source region (i.e., so that the height of the drain region is lower, relative to the top surface of the channel region, than the height of the source region) in order to simultaneously minimize series resistance in the source region and gate to drain capacitance (810). More specifically, these heights of the source and drain regions can be tailored so that series resistance in the source region is less than a predetermined resistance value and so that gate to drain capacitance is less than a predetermined capacitance value.

Thus, for example, the predetermining process can comprise predetermining the height of the source region so that it is will be raised above the level of the top surface of channel region by some predetermined amount and predetermining the height of the drain region so that it will be raised above the level of the top surface of the channel region by some lesser amount or remain approximately level with the top surface of the channel region (811, as illustrated in transistor configuration 200a of FIG. 2). Alternatively, the predetermining process can comprise predetermining the height of the source region so that it will remain approximately level with the top surface of the channel region and predetermining the height of the drain region so that it will be recessed by some predetermined amount below the level of the top surface of the channel region (812, as illustrated in transistor configuration 200b of FIG. 3). Alternatively, the predetermining process can comprise predetermining the height of the source region so that it will be raised above the level of the top surface of the channel region by some predetermined amount and predetermining the height of the drain region so that it will be recessed below the level of the top surface of the channel region by some predetermined amount (813, as illustrated in transistor configuration 200c of FIG. 4).

Once the different heights of the source and drain regions are predetermined at process 808, the deep source region 204 and deep drain region 205 can each be formed in the semiconductor substrate 201 on either side of the channel region (sides 1001 and 1002, respectively) with their respective predetermined heights (816-819). That is, the source region 204 can be formed adjacent to the channel region 202 on one side of the gate electrode 210 such that it has the first predetermined height 214 (816-817). Additionally, the drain region 205 can be formed adjacent to the channel region 202 on another side of the gate electrode 210 opposite the source region 204 such that it has the second predetermined height 215 (818-819). Due to the different predetermined heights 214, 215, the deep source and drain regions 204, 205 may be formed separately (i.e., formed using separate and different method steps 816-817 and 818-819, respectively).

For example, in order to form a source region 204 that is to be raised above the level of the top surface 203 of the channel region 202 (as illustrated in FIGS. 2 and 4), the semiconductor substrate 201 on the drain-side of the gate electrode 210 can be masked. Next, a gate sidewall spacer 221 can be formed adjacent to the gate electrode 210 on the source-side and an additional semiconductor layer 224 (e.g., an epitaxially grown silicon layer) can be formed above the semiconductor substrate 201 adjacent to the gate sidewall spacer 221. Formation of the gate sidewall spacer 221 and additional semiconductor layer 224 can be preceded by an implantation process for forming a shallow source extension region 206. Formation of the additional semiconductor layer 224 can be followed by another implantation process for forming the deep source region 204. Conventional implantation processing techniques can be used to implant the source extension region 206 and deep source region 204 with an appropriate n-type dopant (e.g., phosphorus (P), arsenic (As) or antimony (Sb)), when forming a n-type transistor, or with an appropriate p-type dopant (e.g., boron (B)), when forming a p-type transistor. Similar process steps can be applied on the drain-side to form a drain region that is raised above the level of the top surface of the channel region by some lesser amount.

In order to form a deep drain region 205 that is recessed below the level of the top surface 203 of the channel region 202 (as illustrated in FIGS. 3 and 4), the semiconductor substrate 201 on the source-side of the gate electrode 210 can be masked. Next, a gate sidewall spacer 222 can be formed adjacent to the gate electrode 210 on the drain-side. A selective etch process (e.g., a directional reactive ion etch (RIE) of the silicon substrate selective to the STI oxide) can be used to recess the exposed semiconductor substrate 201 adjacent to the gate sidewall spacer 222. Recessing the drain-side substrate can be followed by an implantation process for forming the deep drain region 205. Again conventional implantation processing techniques can be used to implant the deep drain region 205 with an appropriate n-type dopant (e.g., phosphorus (P), arsenic (As) or antimony (Sb)), when forming a n-type transistor, or with an appropriate p-type dopant (e.g., boron (B)), when forming a p-type transistor.

It should be noted that, during the deep source and drain implant processes, the widths of the gate sidewall spacers 221 and 222 control the positioning of the deep source region 204 and drain regions 205, respectively, relative to the gate electrode 210 (i.e., control the distance of separation between the source and drain regions 204, 205 and the gate electrode 210). In this embodiment, the gate sidewall spacers 221-222 are formed symmetrically (i.e., with the same predetermined width). Thus, as illustrated in FIGS. 2-4, the source and drain regions 204, 205 will be separated from the gate electrode 210 by the same distance (i.e., by a distance that is approximately equal to the sidewall spacer width).

Following source and drain formation, additional processing can be performed (e.g., silicide formation, dielectric layer deposition and planarization, contact formation, etc.) to complete the transistor 200 structure (824).

Figure 9:
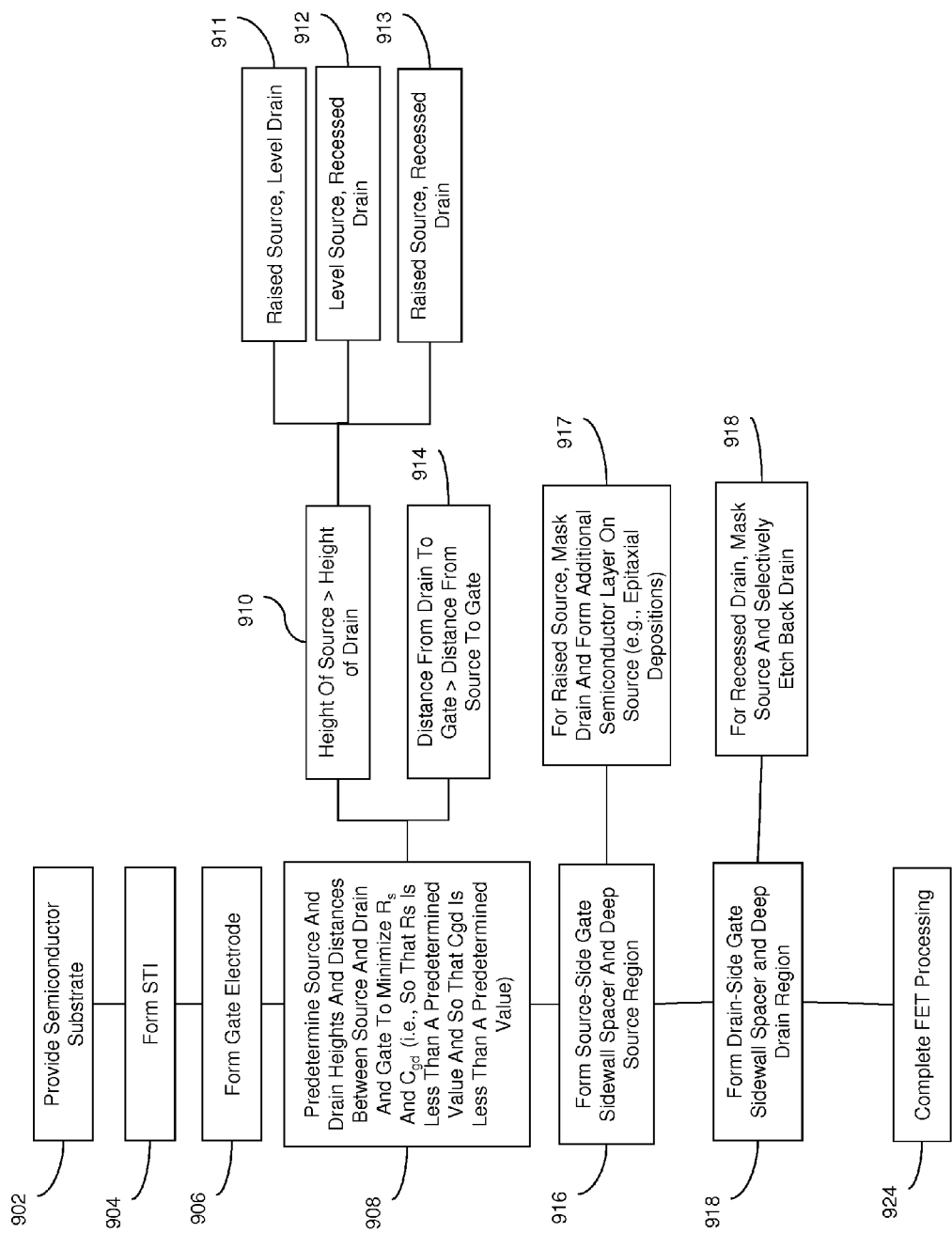
FIG. 9 is a flow diagram illustrating an embodiment of a method for forming the structures 300a-c of FIGS. 5-7.

Referring to FIG. 9 in combination with FIGS. 5-7, also disclosed is an embodiment of forming the asymmetric field effect transistor (FET) structure 300 described above. This method embodiment comprises providing a semiconductor substrate 301 (e.g., a silicon layer of a silicon-on-insulator (SOI) wafer or a bulk silicon wafer) (902). Isolation regions 330 (e.g., dielectric-filled shallow trench isolation regions)

can be form in the semiconductor substrate 301 (904). The isolation regions can be formed using conventional processing techniques so as to set the boundaries of the transistor structure 300.

Next, a gate electrode 310 can be formed on the semiconductor substrate 301 above an area designated for the transistor channel region 302 (e.g., approximately equidistance between the isolation regions 330) such that the channel region 302 is aligned directly below the gate electrode 310 (906). Again, formation of the gate electrode 310 can be accomplished using conventional processing techniques. That is, a gate dielectric layer (e.g., a gate oxide layer) can be deposited. Deposition of the gate dielectric layer can be followed by deposition of a gate conductor layer (e.g., a gate polysilicon layer) and optionally a cap layer (e.g., a nitride cap layer), thereby, forming a gate stack. This gate stack can then be lithographically patterned and etched to form the gate electrode 310 aligned above the area of the semiconductor substrate 301 designated as the channel region 302.

This method embodiment further comprises predetermining not only different heights 314, 315 of the source and drain regions 304, 305 relative to the top surface 303 of the channel region 302, but also different distances 351, 352 between the source and drain regions 304, 305 and the gate 310 in order to simultaneously minimize series resistance in the source region and gate to drain capacitance (908). That is, this method embodiment comprises predetermining each of the following: the height 314 of the source region 304 (i.e., a first height), the height 315 of the drain region 305 (i.e., a second height), the distance 351 between the source region 304 and one side of the gate electrode 310 (i.e., a first distance), and the distance 352 between the drain region 305 and the opposite side of the gate electrode 310 (i.e., a second distance). The heights 314, 315 of the source and drain 304, 305 are predetermined relative to the top surface 303 of the channel region 302. Specifically, this predetermining process 908 can comprise tailoring the different heights 314, 315 of the source and drain regions and the different distances 351, 352 between the source and drain regions and the gate so that the height 315 of the drain region 305 is than the height 314 of the source region 304 (i.e., the height of the drain region is lower, relative to the top surface of the channel region, than the height of the source region) (910) and further so that the distance 352 between the drain region 305 and the gate 310 is greater than the distance 351 between the source region 304 and the gate 310 (914). Varying the distances of the source and drain regions from the gate allows for even greater minimization of series resistance in the source region and gate to drain capacitance over varying the heights of the source and drain regions alone. More specifically, these heights 314, 315 and distances 351, 352 can be tailored so that series resistance in the source region is less than a predetermined resistance value and so that gate to drain capacitance is less than a predetermined capacitance value.

Thus, for example, the predetermining process 908 can comprise predetermining the height 314 of the source region 304 so that it is will be raised above the level of the top surface 303 of channel region 303 by some predetermined amount and predetermining the height 315 of the drain region 305 so that it will be raised above the level of the top surface of the channel region by some lesser amount or remain approximately level with the top surface 303 of the channel region 302 (e.g., as illustrated in transistor structure 300a of FIG. 5) (911). Alternatively, the predetermining process 908 can comprise predetermining the height 314 of the source region 304 so that it will remain approximately level with the top surface 303 of the channel region 302 and predetermining the height 315 of the drain region 305 so that it will be recessed by some predetermined amount below the level of the top surface 303 of the channel region 302 (e.g., as illustrate in transistor structure 300b of FIG. 6) (912). Alternatively, the predetermining process 908 can comprise predetermining the height 314 of the source region 304 so that it will be raised above the level of the top surface 303 of the channel region 302 by some predetermined amount and predetermining the height 315 of the drain region 305 so that it will be recessed below the level of the top surface 303 of the channel region 302 by some predetermined amount. Again, varying the heights 314, 315 of the source and drain regions 304, 305 can be combined with varying the distances 351, 352 between the source and drain regions 304, 305 and the gate electrode 310 to achieve the desired results (i.e., minimized series resistance and gate to drain capacitance) (913).

Once the different heights and separation distances for the source and drain regions are predetermined, the source and drain regions 304, 305 can be formed in the semiconductor substrate 301 on either side of the channel region 302 with their respective predetermined heights 314, 315 and at the respective predetermined distances 351, 352 from the gate electrode 310 (916-919). That is, the source region 304 can be formed adjacent to the channel region 302 on one side of the gate electrode 310 such that it has the first predetermined height 314 and is separated from the gate electrode 310 by the first predetermined distance 351 (916-917). Additionally, the drain region 305 can be formed adjacent to the channel region 302 on another side of the gate electrode 310 opposite the source region 304 such that it has the second predetermined height 315 and is separated from the gate electrode 310 by the second predetermined distance 352 (918-919). Due to the different predetermined heights 314, 315 and the different separation distances 351, 352, the deep source and drain regions 304, 305 may be formed separately (i.e., formed using separate and different method steps 916-917 and 918-919, respectively).

For example, in order to form a source region 304 that is to be raised above the level of the top surface of the channel region 302 (as illustrated in FIGS. 5 and 7) and separated from the gate electrode 310 by a predetermined distance 351, the semiconductor substrate 301 on the drain-side of the gate electrode 310 can be masked. Next, a gate sidewall spacer 321 with a predetermined width 341 that is approximately equal to the predetermined distance 351 can be formed adjacent to the gate electrode 310 on the source-side. Then, an additional semiconductor layer 324 (e.g., an epitaxially grown silicon layer) can be formed above the semiconductor substrate 301 adjacent to the gate sidewall spacer 321. Formation of the gate sidewall spacer 321 and additional semiconductor layer 324 can be preceded by an implantation process for forming a shallow source extension region 306. Formation of the additional semiconductor layer 324 can be followed by another implantation process for forming the deep source region 304. Conventional implantation processing techniques can be used to implant the source extension region 306 and deep source region 304 with an appropriate n-type dopant (e.g., phosphorus (P), arsenic (As) or antimony (Sb)), when forming a n-type transistor, or with an appropriate p-type dopant (e.g., boron (B)), when forming a p-type transistor. Similar process steps can be applied on the drain-side to form a drain region that is raised above the level of the top surface of the channel region by some lesser amount.

In order to form a deep drain region 305 that is recessed below the level of the top surface 303 of the channel region 302 (as illustrated in FIGS. 3 and 4), the semiconductor substrate 301 on the source-side of the gate electrode 310 can be masked. Next, a gate sidewall spacer 322 with a predetermined width 342 approximately equal to the predetermined distance 352 can be formed adjacent to the gate electrode 310 on the drain-side. A selective etch process (e.g., a directional reactive ion etch process selective to silicon over oxide) can be used to recess the exposed semiconductor substrate 301 adjacent to the gate sidewall spacer 322. Recessing the drain-side substrate can be followed by an implantation process for forming the deep drain region 305. Again conventional implantation processing techniques can be used to implant the deep drain region 305 with an appropriate n-type dopant (e.g., phosphorus (P), arsenic (As) or antimony (Sb)), when forming a n-type transistor, or with an appropriate p-type dopant (e.g., boron (B)), when forming a p-type transistor.

It should be noted that, during the deep source and drain implant processes, the different widths of the gate sidewall spacers 321 and 322 control the positioning of the deep source region 304 and deep drain region 305, respectively, relative to the gate electrode 310 (i.e., controls the distance of separation between the source and drain regions 304, 305 and the gate electrode 310). In this embodiment, the gate sidewall spacers 321-322 are formed asymmetrically (i.e., with different predetermined widths that are approximately equal to the desired separation distances 351, 352). Thus, as illustrated in FIGS. 5-7, the source and drain regions 304, 305 will be separated from the gate electrode 310 by the different predetermined distances 351, 352.

Following source and drain formation, additional processing can be performed (e.g., silicide formation, dielectric layer deposition and planarization, contact formation etc.) to complete the transistor 300 structure (924).

FIGS. 10-19 illustrate exemplary processes which may be used to form the various transistor structure configurations described above and, in particular, to form the configuration 300c illustrated in FIG. 7, according to the method embodiment set out in FIG. 9.

Figure 10:
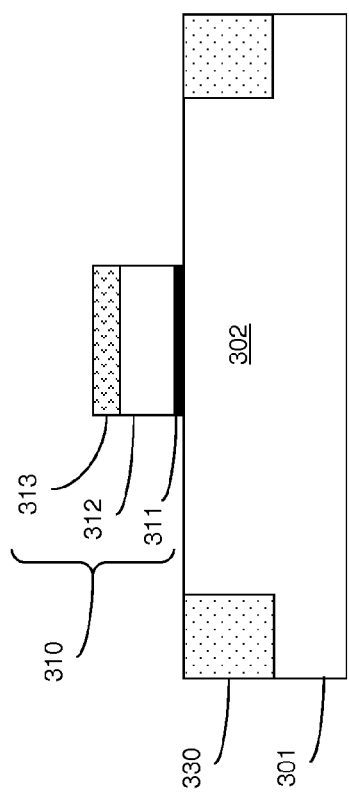
FIG. 10 is a schematic diagram illustrating a partially completed field effect transistor.

Referring to FIG. 10, isolation regions 330 (e.g., dielectric-filled shallow trench isolation structures) can be formed in a semiconductor substrate 301 (e.g., a silicon layer of a silicon-on-insulator (SOI) wafer or a bulk silicon wafer) (902-904). Formation of the isolation regions 330 can be accomplished using conventional processing techniques.

Next, a gate electrode 310 can be formed on the semiconductor substrate 301 above an area designated for the transistor channel region 302 (e.g., approximately equidistance between the isolation regions 320) such that the channel region 320 is aligned directly below the gate electrode 310 (906). Again, formation of the gate electrode 310 can be accomplished using conventional processing techniques. That is, a gate dielectric layer 311 (e.g., a gate oxide layer) can be deposited. Deposition of the gate dielectric layer 311 can be followed by deposition of a gate conductor layer 312 (e.g., a gate polysilicon layer) and optionally a cap layer 313 (e.g., a nitride cap layer), thereby, forming a gate stack. This gate stack can then be lithographically patterned and etched to form the gate electrode 310 aligned above the area of the semiconductor substrate 301 designated as the channel region 302.

As discussed in detail above, the different heights 314, 315 of the source and drain regions 304, 305 as well as their different separation distances 351, 352 from the gate 310 are predetermined (908). Once the different heights and separation distances for the source and drain regions are predetermined, the source and drain regions 304, 305 can be formed in the semiconductor substrate 301 on either side of the channel region 302 with their respective predetermined heights 314, 315 and at the respective predetermined distances 351, 352 from the gate electrode 310 (916-919). Due to the different predetermined heights 314, 315 and the different separation distances 351, 352, the deep source and drain regions 304, 305 may be formed separately (i.e., formed using separate and different method steps 916-917 and 918-919, respectively).

Figure 11:
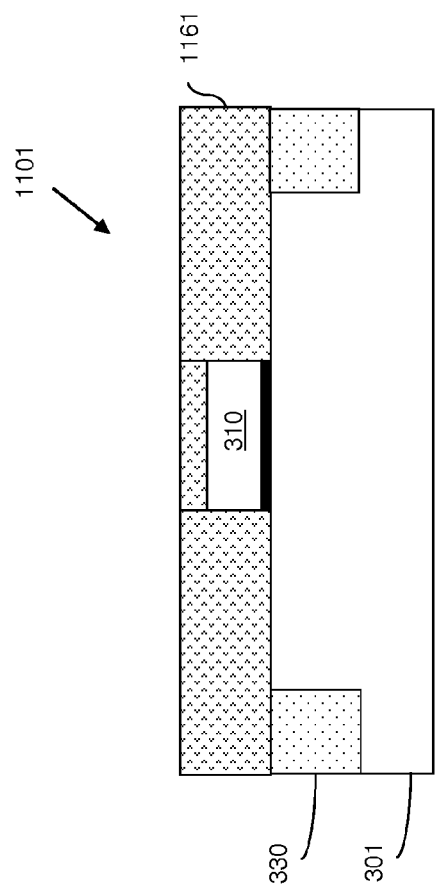
FIG. 11 is a schematic diagram illustrating a partially completed field effect transistor.
Figure 12:
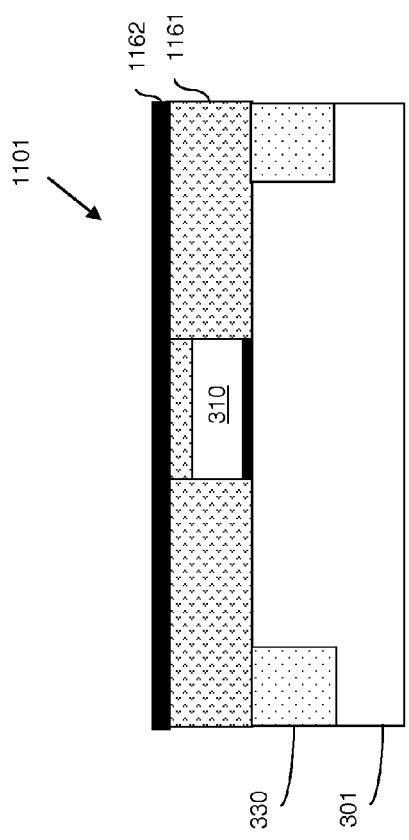
FIG. 12 is a schematic diagram illustrating a partially completed field effect transistor 300c.
Figure 13:
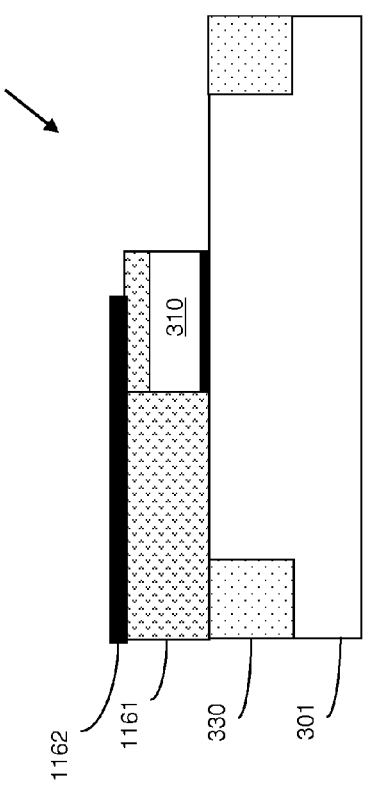
FIG. 13 is a schematic diagram illustrating a partially completed field effect transistor.
Figure 14:
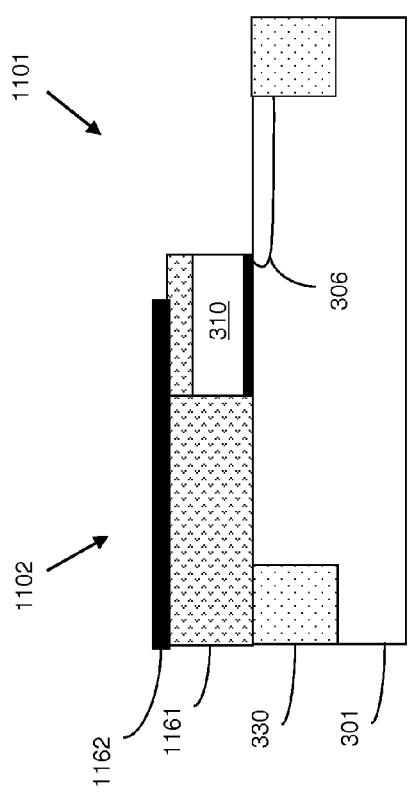
FIG. 14 is a schematic diagram illustrating a partially completed field effect transistor.
Figure 15:
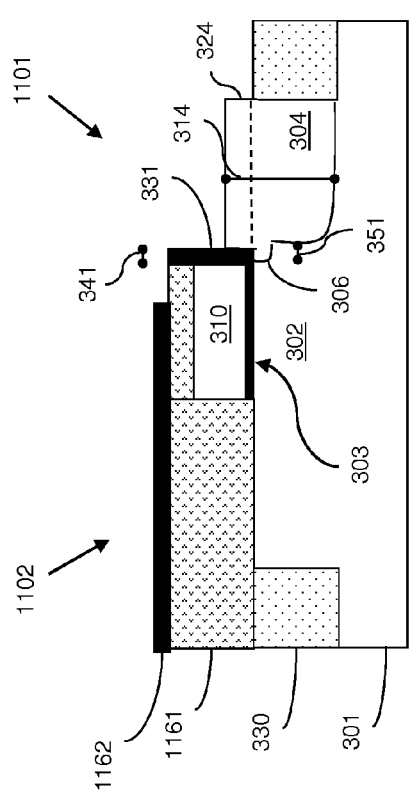
FIG. 15 is a schematic diagram illustrating a partially completed field effect transistor.
Figure 16:
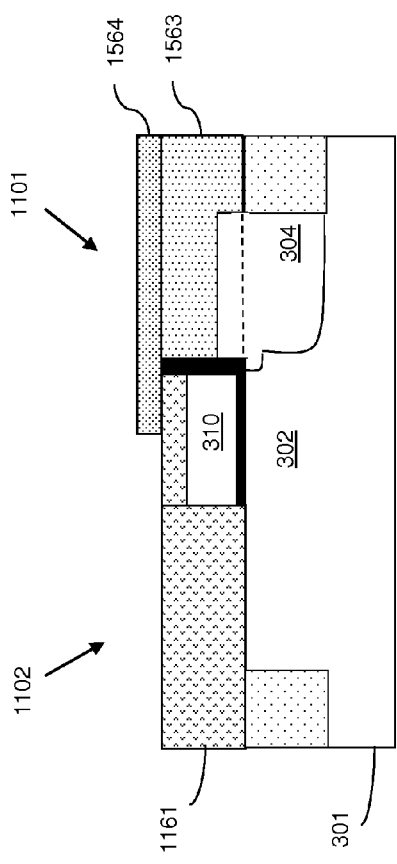
FIG. 16 is a schematic diagram illustrating a partially completed field effect transistor.
Figure 17:
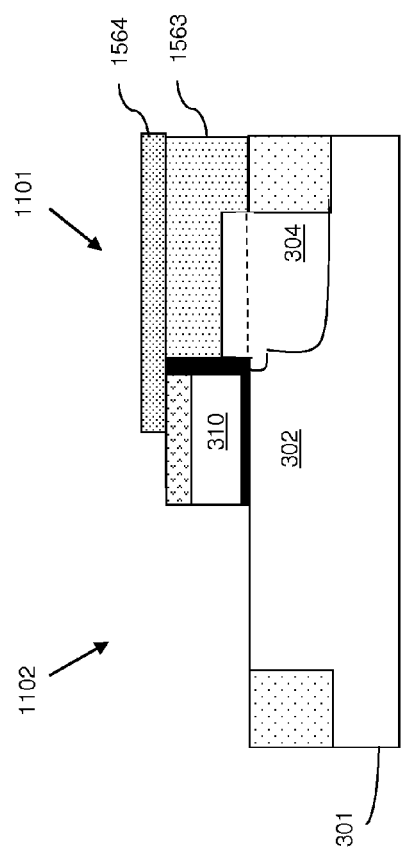
FIG. 17 is a schematic diagram illustrating a partially completed field effect transistor.

At processes 916-917, a nitride layer 1161 can be deposited and planarized (e.g., using conventional chemical mechanical planarization (CMP) techniques (see FIG. 11). Next, a thin oxide layer 1162 can be deposited on the nitride layer 1161 (see FIG. 12). The oxide layer 1162 can be patterned to expose the nitride layer 1161 on the source-side 1101 of the gate electrode 310 and the exposed nitride can be selectively removed (see FIG. 13). Once the semiconductor substrate 301 on the source-side 1101 of the gate electrode 310 is exposed, a shallow source extension 306 can be formed (see FIG. 14). That is, a conventional implantation process can be used to dope a shallow source extension 306 with an appropriate n-type or p-type dopant. Masking (i.e., nitride and oxide layers 1161-1162) over the drain-side 1102 of the gate electrode 310 protects the semiconductor substrate 301 on the drain-side 1102 during the source extension implant.

Following source extension 306 formation, a nitride film can be deposited and anisotropically (i.e., directionally) etched to form a gate sidewall spacer 321 on the source-side 1101 of the gate 310 such that the spacer 321 has the predetermined width 341. Next, an additional semiconductor layer 324 can be formed on the semiconductor substrate 301 on the source-side 1102 of the gate electrode 310 adjacent to the sidewall spacer 321. Formation of the additional semiconductor layer 324 can be accomplished using conventional processing techniques to epitaxially grow a silicon layer on the exposed substrate 301, while the substrate 301 on the drain-side 1102 of the gate electrode is still masked. Once the additional layer 324 is formed, a second implantation process can be performed in order to form the deep source region 304 that is separated from the gate electrode 310 by the predetermined distance 351 (i.e., by the width 341 of spacer 321) (see FIG. 15).

At processes 918-919, a blanket oxide layer 1563 can be deposited and planarized (e.g., using conventional CMP). Deposition of the blanket oxide layer 1563 can be followed by deposition of another thin oxide layer 1564. This thin oxide layer 1564 can be patterned to expose the nitride layer 1161 on the drain side 1102 of the gate electrode 310 (see FIG. 16). The exposed nitride layer 1161 can be selectively removed to expose the semiconductor substrate 301 on the drain-side 1102 of the gate electrode 310 (see FIG. 17).

Figure 18:
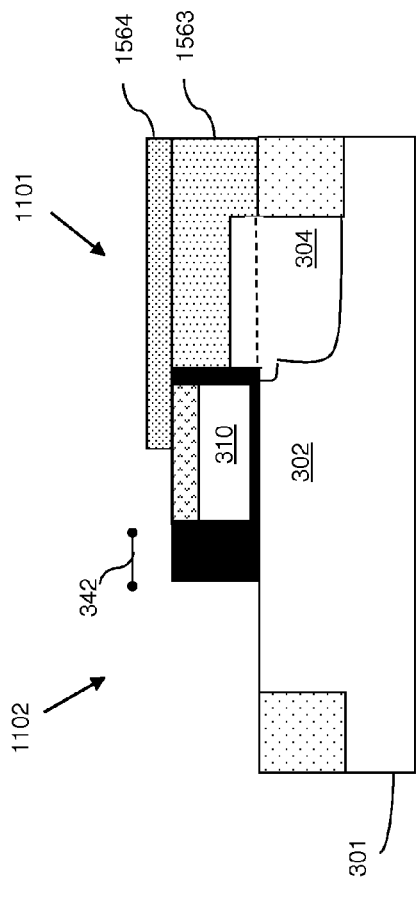
FIG. 18 is a schematic diagram illustrating a partially completed field effect transistor.
Figure 19:
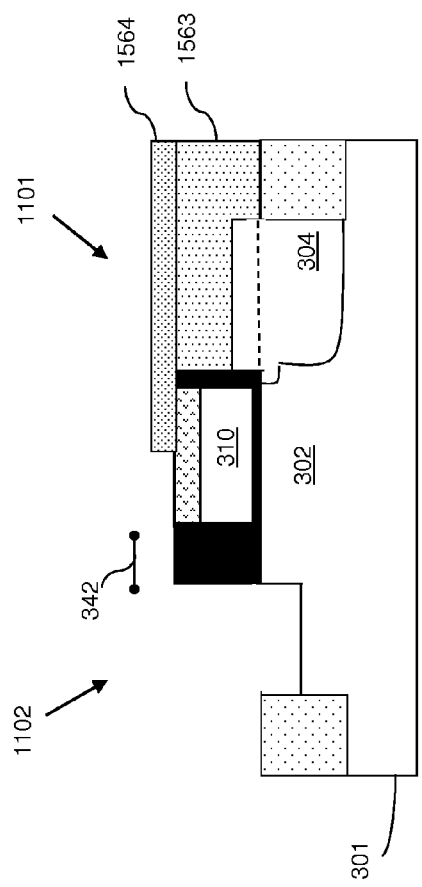
FIG. 19 is a schematic diagram illustrating a partially completed field effect transistor.
Figure 20:
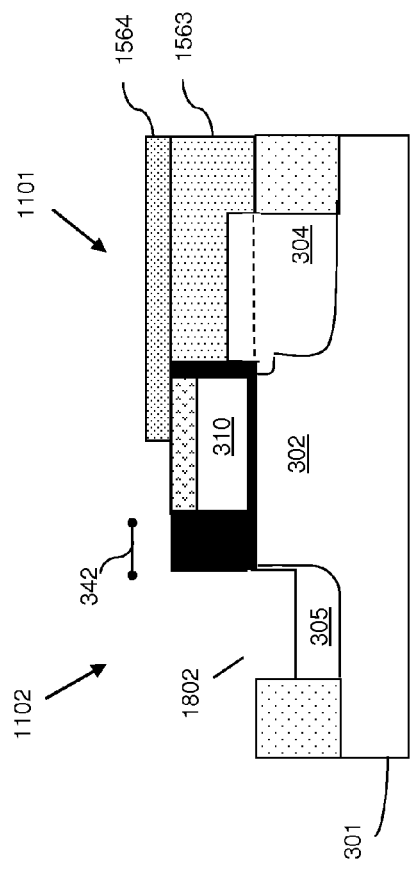
FIG. 20 is a schematic diagram illustrating a partially completed field effect transistor.

Next, a nitride film can be deposited and anisotropically (i.e., directionally) etched to form a gate sidewall spacer 322 on the drain-side 1102 of the gate 310 such that the sidewall spacer 322 has the predetermined thickness 342 determined at process 908 (see FIG. 18). Following formation of the spacer 322, the depth of the semiconductor substrate 301 on the drain-side 1102 of the gate electrode 310 can be selectively etched back (e.g., using a directional reactive ion etch (RIE) process to form recess 1802) (see FIG. 19). This recessing process can be followed by another implantation process to form the deep drain region 304 (see FIG. 20).

Figure 21:
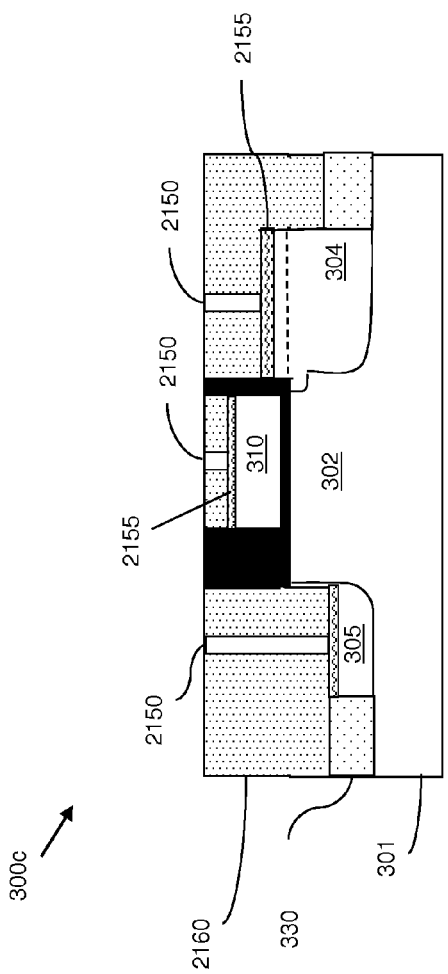
FIG. 21 is a schematic diagram illustrating a completed field effect transistor.

At process 924, transistor 300c can be completed (see FIG. 21). For example, the following conventional processing steps can be performed to complete the transistor 300. For example, silicide 2155 can be formed on the source and drain regions 304, 305 as well as the polysilicon gate conductor 310. This can be accomplished by depositing and planarizing an additional oxide layer. Next, the additional oxide layer can be selectively and directionally etched to expose the silicon source and drain and polysilicon gate conductor. It is understood that, as illustrated, some recess of the STI regions 330 will occur during this etching process to the extent that the drain 305 is recessed. Once the silicon/polysilicon is exposed, conventional silicide formation processes can be performed (e.g., deposition of a metal layer, such as nickel, titanium or cobalt, followed by an anneal to form silicide regions at the silicon/polysilicon-metal interfaces). Additional FET processing can include dielectric layer 2160 deposition and planaraization, contact 2150 formation, etc. The resulting structure 300 provides both a low resistance raised source region 304 having a thin gate sidewall spacer 321 and a low capacitance recessed drain region 305 with a thick gate sidewall spacer 322.

Therefore, disclosed above are embodiments of an asymmetric field effect transistor (FET) structure and a method of forming the structure in which both series resistance in the source region ($R_s$) and gate to drain capacitance ($C_{gd}$) are reduced in order to provide optimal performance (i.e., to provide improved drive current with minimal circuit delay). Specifically, different heights of the source and drain regions and/or different distances between the source and drain regions and the gate are tailored to minimize series resistance in the source region (i.e., in order to ensure that series resistance is less than a predetermined resistance value) and in order to simultaneously to minimize gate to drain capacitance (i.e., in order to simultaneously ensure that gate to drain capacitance is less than a predetermined capacitance value).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments herein can be practiced with modification within the spirit and scope of the appended claims.

What is claimed is:

1. A field effect transistor structure comprising:
   a channel region having a top surface, said top surface having side portions and a center portion positioned laterally between and coplanar with said side portions;
   a gate electrode on said center portion;
   gate sidewall spacers on said side portions and positioned laterally adjacent to opposing sidewalls of said gate electrode;
   a source region adjacent to said channel region and having a first predetermined height relative to said top surface;
   a drain region adjacent to said channel region opposite said source region,
   said drain region having a second predetermined height relative to said top surface,
   said second predetermined height being different from said first predetermined height relative to said top surface, and
   values of said first predetermined height and said second predetermined height being tailored such that series resistance in said source region is less than a predetermined resistance value and to simultaneously ensure that gate to drain capacitance is less than a predetermined capacitance value.

2. The structure of claim 1, said first predetermined height being above said top surface and said second predetermined height being approximately level with said top surface.

3. The structure of claim 1, said first predetermined height being above said top surface and said second predetermined height being above said top surface by a lesser amount.

4. The structure of claim 1, said first predetermined height being above said top surface and said second predetermined height being below said top surface.

5. The structure of claim 1, said first predetermined height being approximately level with said top surface and said second predetermined height being below said top surface.

6. The structure of claim 1, further comprising isolation regions adjacent to said source region and said drain region and a gate electrode on said top surface approximately equidistance between said isolation regions.

7. A field effect transistor structure comprising:
   a channel region having a top surface;
   a source region adjacent to said channel region and having a first predetermined height relative to said top surface;
   a drain region adjacent to said channel region opposite said source region,
   said drain region having a second predetermined height relative to said top surface,
   said second predetermined height being lower relative to said top surface than said first predetermined height, and
   values of said first predetermined height and said second predetermined height being tailored such that series resistance in said source region is less than a predetermined resistance value and to simultaneously ensure that gate to drain capacitance is less than a predetermined capacitance value.

8. The structure of claim 7, said first predetermined height being above said top surface and said second predetermined height being approximately level with said top surface.

9. The structure of claim 7, said first predetermined height being above said top surface and said second predetermined height being above said top surface by a lesser amount.

10. The structure of claim 7, said first predetermined height being above said top surface and said second predetermined height being below said top surface.

11. The structure of claim 7, said first predetermined height being approximately level with said top surface and said second predetermined height being below said top surface.

12. The structure of claim 7, further comprising isolation regions adjacent to said source region and said drain region and a gate electrode on said top surface approximately equidistance between said isolation regions.

13. The structure of claim 12, further comprising nitride sidewall spacers on sidewalls of said gate electrode.

14. A field effect transistor structure comprising:
   a channel region having a top surface;
   a source region adjacent to said channel region and having a first predetermined height relative to said top surface;
   a drain region adjacent to said channel region opposite said source region,
   said drain region having a second predetermined height relative to said top surface,
   said second predetermined height being lower relative to said top surface than said first predetermined height,
   a first distance being between said source region and a first side of said gate electrode,
   a second distance being between said drain region and a second side of said gate electrode opposite said first side, and said second distance being greater than said first distance, and values of said first predetermined height, said second predetermined height, said first distance, and said second distance being tailored such that series resistance in said source region is less than a predetermined resistance value and to simultaneously ensure that gate to drain capacitance is less than a predetermined capacitance value.

15. The structure of claim 14, said first predetermined height being above said top surface and said second predetermined height being approximately level with said top surface.

16. The structure of claim 14, said first predetermined height being above said top surface and said second predetermined height being above said top surface by a lesser amount.

17. The structure of claim 14, said first predetermined height being above said top surface and said second predetermined height being below said top surface.

18. The structure of claim 14, said first predetermined height being approximately level with said top surface and said second predetermined height being below said top surface.

19. The structure of claim 14, further comprising isolation regions adjacent to said source region and said drain region and a gate electrode on said top surface approximately equidistance between said isolation regions.

* * * * *